United States Patent
Kim et al.

(10) Patent No.: US 9,347,125 B2
(45) Date of Patent: May 24, 2016

(54) ETCHANT COMPOSITION AND METHOD OF FORMING METAL WIRE AND THIN FILM TRANSISTOR ARRAY PANEL USING THE SAME

(71) Applicants: Samsung Display Co., Ltd., Yongin (KR); DONGWOO FINE-CHEM CO., LTD., Iksan-si (KR)

(72) Inventors: In-Bae Kim, Yongin-si (KR); Jong-Hyun Choung, Hwaseong-si (KR); Seon-Il Kim, Seoul (KR); Hong-Sick Park, Suwon-si (KR); Wang Woo Lee, Suwon-si (KR); Jae-Woo Jeong, Incheon (JP); In Seol Kuk, Iksan-si (KR); Sang-Tae Kim, Iksan-si (KR); Young-Chul Park, Iksan-si (KR); Keyong Bo Shim, Iksan-si (KR); In-Ho Yu, Iksan-si (KR); Young-Jin Yoon, Jeonju-si (KR); Suck-Jun Lee, Jeonju-si (KR); Joon-Woo Lee, Jeonju-si (KR); Sang-Hoon Jang, Jeonju-si (KR); Young-Jun Jin, Iksan-si (KR)

(73) Assignees: Samsung Display Co., Ltd., Yongin-si (KR); DONGWOO FINE-CHEM CO., LTD., Iksan-si (KR)

(*) Notice: Subject to any disclaimer, the term of this patent is extended or adjusted under 35 U.S.C. 154(b) by 0 days.

(21) Appl. No.: 14/725,849

(22) Filed: May 29, 2015

(65) Prior Publication Data

US 2015/0259598 A1  Sep. 17, 2015

Related U.S. Application Data

(62) Division of application No. 13/718,557, filed on Dec. 18, 2012, now Pat. No. 9,045,833.

(30) Foreign Application Priority Data

Jul. 23, 2012  (KR) .................. 10-2012-0079973

(51) Int. Cl.
  *C23F 1/18* (2006.01)
  *C22F 1/18* (2006.01)
  (Continued)

(52) U.S. Cl.
  CPC . *C22F 1/18* (2013.01); *C09K 13/00* (2013.01); *C09K 13/04* (2013.01); *C09K 13/06* (2013.01);
  (Continued)

(58) Field of Classification Search
  None
  See application file for complete search history.

(56) References Cited

U.S. PATENT DOCUMENTS 8,262,928 B2   9/2012   Kim et al.
8,785,935 B2   7/2014   Park et al.
(Continued)

FOREIGN PATENT DOCUMENTS

JP   2008-280605   11/2008
JP   4749179   5/2011
(Continued)

OTHER PUBLICATIONS

"Organic Acid". Wikipedia, http://en.wikipedia.org/wiki/Organi__Acid, online, Apr. 25, 2014.
(Continued)

*Primary Examiner* — Jiong-Ping Lu
(74) *Attorney, Agent, or Firm* — H.C. Park & Associates, PLC

(57) ABSTRACT

A etchant composition that includes, based on a total weight of the etchant composition, about 0.5 wt % to about 20 wt % of a persulfate, about 0.5 wt % to about 0.9 wt % of an ammonium fluoride, about 1 wt % to about 10 wt % of an inorganic acid, about 0.5 wt % to about 5 wt % of a cyclic amine compound, about 0.1 wt % to about 10.0 wt % of a sulfonic acid, about 5 wt % to about 10 wt % of an organic acid or a salt thereof, and a remainder of water. The etchant composition may be configured to etch a metal layer including copper and titanium, to form a metal wire that may be included in a thin film transistor array panel of a display device.

11 Claims, 19 Drawing Sheets

(51) Int. Cl.

| | | |
|---|---|---|
| *H01L 21/28* | (2006.01) | |
| *C23F 1/26* | (2006.01) | |
| *H01L 27/12* | (2006.01) | |
| *H01L 21/3213* | (2006.01) | |
| *C09K 13/00* | (2006.01) | |
| *C09K 13/04* | (2006.01) | |
| *C09K 13/06* | (2006.01) | |
| *C09K 13/08* | (2006.01) | |
| *C23F 1/14* | (2006.01) | |
| *C23F 1/44* | (2006.01) | |
| *H01L 21/32* | (2006.01) | |
| *H05K 3/06* | (2006.01) | |

(52) U.S. Cl.
CPC . *C09K 13/08* (2013.01); *C23F 1/14* (2013.01); *C23F 1/26* (2013.01); *C23F 1/44* (2013.01); *H01L 21/28008* (2013.01); *H01L 21/32* (2013.01); *H01L 21/32134* (2013.01); *H01L 27/124* (2013.01); *H01L 27/1288* (2013.01); *H05K 3/067* (2013.01)

(56) References Cited

U.S. PATENT DOCUMENTS

| | | | |
|---|---|---|---|
| 2008/0224092 A1 | 9/2008 | Choung et al. | |
| 2010/0291722 A1* | 11/2010 | Kim et al. | 438/38 |
| 2010/0301010 A1 | 12/2010 | Lin et al. | |
| 2011/0079776 A1* | 4/2011 | Choi et al. | 257/43 |
| 2012/0153287 A1 | 6/2012 | Park et al. | |
| 2012/0322187 A1 | 12/2012 | Choung et al. | |

FOREIGN PATENT DOCUMENTS

| | | |
|---|---|---|
| KR | 10-2009-0059961 | 6/2009 |
| KR | 10-2010-0123131 | 11/2010 |
| KR | 10-2011-0026050 | 3/2011 |
| KR | 10-2011-0085254 | 7/2011 |
| KR | 10-2011-0116761 | 10/2011 |
| KR | 10-2011-0120421 | 11/2011 |
| KR | 10-2011-0120422 | 11/2011 |
| KR | 10-2012-0015489 | 2/2012 |

OTHER PUBLICATIONS

Non Final Office Action issued on Jan. 10, 2014, in U.S. Appl. No. 13/718,557.

Final Office Action issued on May 8, 2014, in U.S. Appl. No. 13/718,557.

Non Final Office Action issued on Aug. 14, 2014, in U.S. Appl. No. 13/718,557.

Notice of Allowance issued on Jan. 30, 2015, in U.S. Appl. No. 13/718,557.

* cited by examiner

ETCHANT COMPOSITION AND METHOD OF FORMING METAL WIRE AND THIN FILM TRANSISTOR ARRAY PANEL USING THE SAME

CROSS-REFERENCE TO RELATED APPLICATION

This application is a Divisional of U.S. patent application Ser. No. 13/718,557, filed on Dec. 18, 2012, now issued as U.S. Pat. No. 9,045,833, and claims priority to and the benefit of Korean Patent Application No. 10-2012-0079973, filed on Jul. 23, 2012, which are hereby incorporated by reference for all purposes as if fully set forth herein.

BACKGROUND

1. Field

Exemplary embodiments of the present invention relate to an etchant composition and a method of forming a metal wire and a thin film transistor array panel, using the same.

2. Discussion of the Background

In general, a thin film transistor (TFT) array panel is used as a circuit board for independently driving each pixel in a liquid crystal display, an organic electroluminescence (EL) display device, or the like. The thin film transistor array panel includes a gate wire to transfer a scanning signal, a data wire to transfer an image signal, a thin film transistor connected to the gate wire and the data wire, a pixel electrode connected to the thin film transistor, and the like.

The thin film transistor includes a gate electrode that is a portion of the gate wire, a semiconductor layer forming a channel, and source and drain electrodes that are portions of the data wire. The thin film transistor is a switching element to transfer a data voltage transferred through the data wire to the pixel electrode or to interrrup the data voltage according to the gate signal transferred through the gate wire.

When the thin film transistor is manufactured, a metal layer is laminated on a substrate with a wire material for forming gate or source/drain electrodes, and an etching process to form wires of an electric circuit by using a gas or a solution having a corrosive property.

The above information disclosed in this Background section is only for enhancement of understanding of the background of the invention and therefore it may contain information that does not form the prior art that is already known in this country to a person of ordinary skill in the art.

SUMMARY

Exemplary embodiments of the present invention provide an etchant composition that has a high etching ratio to metal and improved temporal characteristics, to increase a process number quantity.

Exemplary embodiments of present invention also provide an etchant composition that minimizes a glass and PR lifting phenomenon while etching metal, in order to provide a method of forming a metal wire having reduced wire defects such as disconnections.

In addition, exemplary embodiments of the present invention provide an etchant composition that substantially prevents the generation of environmentally regulated materials and that minimizes a heat emission phenomenon that may occur during treatment of waste water.

Additional features of the invention will be set forth in the description which follows, and in part will be apparent from the description, or may be learned by practice of the invention.

An exemplary embodiment of the present invention provides an etchant composition including, based on a total weight of the etchant composition, about 0.5 wt % to about 20 wt % of a persulfate, about 0.5 wt % to about 0.9 wt % of an ammonium fluoride, about 1 wt % to about 10 wt % of an inorganic acid, about 0.5 wt % to about 5 wt % of a cyclic amine compound, about 0.1 wt % to about 10.0 wt % of a sulfonic acid, about 5 wt % to about 10 wt % of an organic acid or a salt thereof, and a remainder of water.

Another exemplary embodiment of the present invention provides a method of manufacturing a metal wire, including: laminating copper layer and a titanium layer to form a metal layer, forming a photosensitive film pattern on the metal layer, and etching a portion of the metal layer using the photosensitive film pattern as a mask, and removing the photosensitive film pattern, wherein the metal layer is etched by the etchant composition.

Yet another exemplary embodiment of the present invention provides a method of manufacturing a thin film transistor array panel, including: forming a gate line and a gate electrode connected to the gate line on a substrate, forming a data line dielectrically crossing the gate line, a source electrode connected to the data line, and a drain electrode spaced from the source electrode, and forming a pixel electrode connected to the drain electrode, wherein the forming of the gate line and the gate electrode connected to the gate line includes laminating copper and titanium layers to form a metal layer, etching the metal layer using a photosensitive film pattern as a mask, and removing the photosensitive film pattern. The metal layer is etched using the etchant composition.

According to the exemplary embodiment of the present invention, provided is an etchant composition that reduces gate disconnection defects and gate pattern defects, has a high etching ratio, and has improved temporal characteristics, to increase a process number quantity.

According to the exemplary embodiment of the present invention, provided is an etchant composition that reduces damage to an organic substrate and a photoresist lifting phenomenon while etching metal, in order to reduce wire defects such as disconnections.

According to the exemplary embodiment of the present invention, provided is an etchant composition including ammonium fluoride, in order to eliminate the need for using arsenic (As).

According to the exemplary embodiment of the present invention, provided is an etchant composition that includes a content of sulfonic acid that is adjusted in order to mitigate rapid heat emission in waste water.

According to the exemplary embodiment of the present invention, provided is a metal wire having reduced wire defects such as disconnections.

According to the exemplary embodiment of the present invention, provided is a display device having a high quality, by manufacturing a thin film transistor array panel using the method of manufacturing the metal wire.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
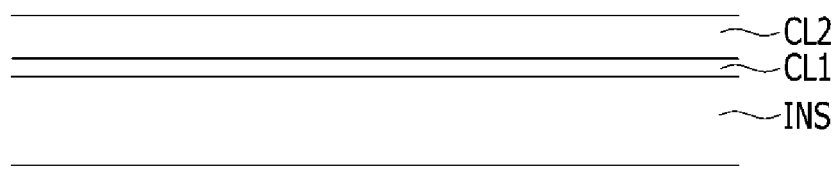
FIGS. 1, 2, 3, 4, and 5 are cross-sectional views sequentially showing a method of forming a metal wire using an etchant composition, according to an exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. In addition, it will be understood that for the purposes of this disclosure that "at least one selected from the group consisting of X, Y, and Z refers to any one or X, Y, or Z, or any combination thereof Hereinafter, an etchant composition according to an exemplary embodiment of the present invention will be described. The etchant composition may be used to etch a double layer formed of a copper layer and a titanium layer laminated on a substrate, thus forming a metal wire.

According to various embodiments, the etchant composition includes a persulfate, an ammonium fluoride, an inorganic acid, a cyclic amine compound, a sulfonate, and an organic acid or a salt thereof.

The persulfate is a primary oxidant that etches the titanium layer and the copper layer simultaneously. Persulfate may be included in a content of about 0.5 wt % to about 20 wt %, based on the total weight of the etchant composition. If the content of persulfate is less than about 0.5 wt %, the etching ratio may be reduced, which may prevent proper etching. If the content of persulfate is more than about 20 wt %, the etching ratio may become excessively high. Thus, it may be difficult to control the degree of etching, such that the titanium layer and/or the copper layer may be overetched.

Examples of the persulfate may include potassium persulfate ($K_2S_2O_8$), sodium persulfate ($Na_2S_2O_8$), ammonium persulfate (($NH_4$)$_2S_2O_8$), or any mixture thereof. Ammonium ions included in the ammonium fluoride serve to control an etch rate of copper and increase an etching effect of the titanium layer, which is a barrier layer material, through fixing to a copper surface. The ammonium ions also operate to control the pH, thereby reducing a residual ratio.

The ammonium fluoride be included in a content of 0.01 to 2 wt %, based on the total weight of the etchant composition. If ammonium fluoride is included in a content of less than 0.01 wt %, the etch rate of the titanium layer material is significantly reduced. Thus, it is difficult to maintain an appropriate etching time. If the content is more than 2 wt %, the etch rate of copper is significantly reduced. Accordingly, it is difficult to control an etching amount of copper, there is a difficulty in controlling the process, and the glass substrate on which the titanium is laminated may be etched. According to some embodiments, the ammonium fluoride may be included in a content of about 0.5 wt % to about 0.9 wt %, based on the total weight of the etchant composition.

The inorganic acid is an auxiliary oxidant. In the etchant composition, the etch rate may be controlled according to the content of the inorganic acid. The inorganic acid may be reacted with copper ions in the etchant composition, such that the amount of the copper ions is limited, in order to prevent a reduction in etching ratio. The inorganic acid is included in a content of about 1 wt % to about 10 wt %, based on the total weight of the etchant composition. If the content of the inorganic acid is less than about 1 wt %, the etching ratio may be reduced, such at the etch rate may be insufficient. If the content is more than about 10 wt %, cracks may be formed in a photosensitive film used to mask the metal layer, or the photosensitive film may be peeled. In the case where the cracks are formed in the photosensitive film or the photosensitive film is peeled, the titanium layer or the copper layer positioned below the photosensitive film may be overetched.

The inorganic acid may include nitric acid, sulfuric acid, phosphoric acid, perchloric acid, or any mixture thereof.

The cyclic amine compound is a corrosion inhibitor. The etch rate of the copper layer may be controlled according to the content of the cyclic amine compound in the etchant composition. The cyclic amine compound is included in the content of about 0.5 wt % to about 5.0 wt %, based on the total weight of the etchant composition. If the content of the cyclic amine compound is less than about 0.5 wt %, the etching ratio of the copper layer may be increased, which may cause overetching. If the content is more than about 5.0 wt %, the etching ratio of copper may be reduced below a desired degree of etching.

Examples of the cyclic amine compound include aminotetrazole, imidazole, indole, purine, pyrazole, pyridine, pyrimidine, pyrrole, pyrrolidine, pyrroline, or any mixture thereof.

The sulfonic acid is an additive for preventing a temporal change in the etchant composition (enhancing storage characteristics). The sulfonic acid is dissociated into sulfate ions ($SO_4^{2-}$) in the etchant composition, to reduce a hydrolysis rate of ammonium persulfate. The sulfonic acid prevents instability of the etching ratio of copper and titanium, according to an increase in a number of applications of the etchant composition.

The sulfonic acid may be included in a content of about 0.1 wt % to about 10.0 wt %, based on the total weight of the etchant composition. The sulfonic acid may include p-toluenesulfonic acid or methanesulfonic acid. According to some embodiments, the sulfonic acid may be included in a content of about 3 wt %, based on the total weight of the etchant composition.

The organic acid or a salt thereof is included in a content of about 0.1 wt % to about 12 wt %, based on the total weight of the etchant composition. The organic acid or the salt thereof acts as a chelating agent to form complexes with the copper ions in the etchant composition, thus controlling the etch rate of copper. If the content of the organic acid is less than about 0.1 wt %, the etch rate of copper may be difficult to control, causing overetching. If the content is more than about 12 wt %, the etch rate of copper is reduced, increasing an etching time of the process. Accordingly, the number of substrates that can be treated may be reduced. According to some embodiments, the organic acid may be included in a content of 5 wt % to 10 wt %, based on the total weight of the etchant composition.

The organic acid may include a carboxylic acid, a dicarboxylic acid, or a tricarboxylic acid. Specific examples of the organic acid may include acetic acid, butanoic acid, citric acid, formic acid, gluconic acid, glycolic acid, malonic acid, oxalic acid, pentanoic acid, sulfobenzoic acid, sulfosuccinic acid, sulfophthalic acid, salicylic acid, sulfosalicylic acid, benzoic acid, lactic acid, glyceric acid, succinic acid, malic acid, tartaric acid, isocitric acid, propenoic acid, imminodiacetic acid, ethylenediaminetetraacetic acid (EDTA), or any mixture thereof. The organic acid salt may include a potassium salt, a sodium salt, or an ammonium salt, of the aforementioned organic acids.

The etchant composition may include an additional etching controlling agent, a surfactant, and a pH controlling agent, in addition to the aforementioned elements. The etchant composition may include a remainder of water, so that the total weight of the etchant composition is 100 wt %. The water may be deionized water.

The etchant composition may be used in a process of manufacturing an electronic device, and specifically, may be used to etch a metal layer laminated on a substrate, during the process of manufacturing the electronic device. The etchant composition may, in particular, be used to etch the double layer formed of titanium and copper to form a gate wire, during the process of manufacturing the display device.

The etchant composition has a higher stability over time, as compared to a general etchant composition. In the case of the general etchant composition, a decomposition reaction occurs in the etchant composition, such that a concentration of the oxidant in the etchant composition is reduced. Accordingly, etching characteristics of the general etchant composition, for example, an etching ratio, a taper angle, a lateral side cut dimension Loss (CD loss), and the like, may be degraded over time.

However, the sulfonic acid is added to the present etchant to increase the temporal stability thereof. Accordingly, the accumulated process number per a predetermined time of the substrate that can be treated by the etchant composition may be increased, and uniform etching may be obtained.

Particularly, in the case where the metal wire having the titanium layer and the copper layer is etched using the etchant composition, the metal wire having a taper angle ($\theta$) of about 25° to about 50° may be obtained. This taper angle will be compared to the Comparative Example.

FIGS. 1 to 5 are cross-sectional views sequentially showing a method of forming a metal wire using an etchant composition, according to an exemplary embodiment of the present invention. Referring to FIG. 1, a metal layer is laminated on an insulating substrate INS. The metal layer includes a first metal layer CL1 formed of a first metal and a second metal layer CL2 formed of a second metal that is different from the first metal. The second metal layer CL2 is laminated on the first metal layer CL1. Herein, the first metal may be titanium, and the second metal may be copper. However, the present invention is not limited to any particular type of metal layer. For example, the metal layer may be a single layer formed of an alloy including the first metal and the second metal, or a multilayer of three or more layers, in which the first metal layer CL1 and the second metal layer CL2 are alternately laminated.

Figure 2:
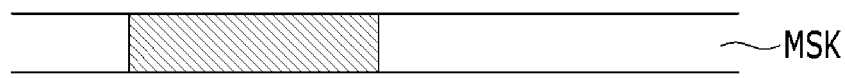
Figure 2:
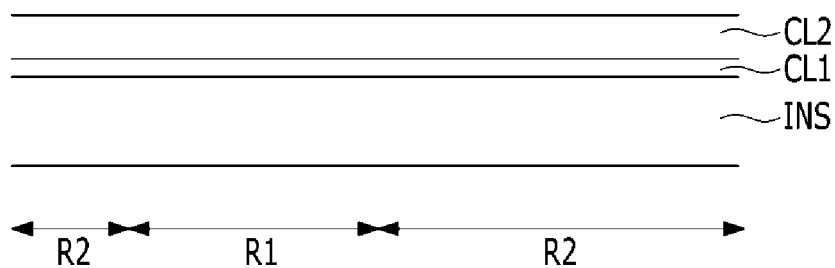

Next, as shown in FIG. 2, a photosensitive film PR is formed on an entire surface of the insulating substrate INS, and is then exposed through a mask MSK. The mask MSK includes a first region R1 completely blocking radiated light and a second region R2 allowing all or a portion of light to be transmitted thereto to pass therethrough. An upper surface of the insulating substrate INS is divided into regions corresponding to the first region R1 and the second region R2. Hereinafter, the corresponding regions of the insulating substrate INS are referred to as being included in the first region R1 and the second region R2.

Figure 3:
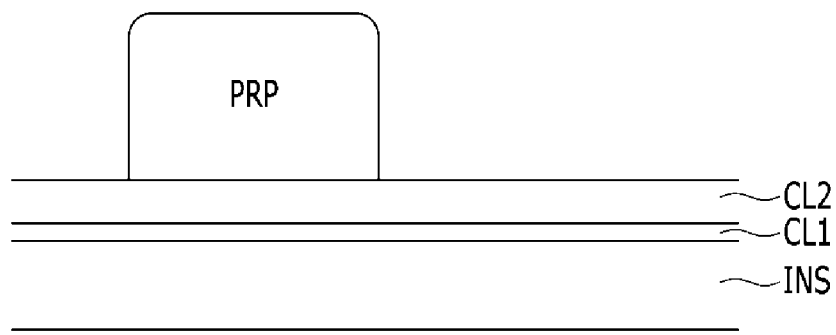

The photosensitive film PR exposed through the mask MSK is developed, as shown in FIG. 3, a photosensitive film pattern PRT having a predetermined thickness remains in a region where light is blocked by the first region R1, and the photosensitive film is completely removed in the second region R2 through which light is transmitted to expose the surface of the insulating substrate INS.

Herein, a positive photoresist is used so as to remove the exposed portion of the photosensitive film. However, the present invention is not limited thereto, and a negative photoresist may be used according to other embodiments.

Figure 4:
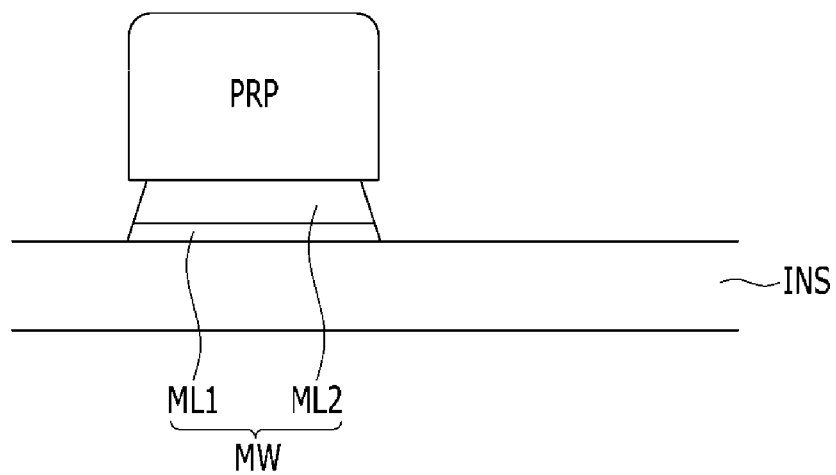

Next, as shown in FIG. 4, the first metal layer CL1 and the second metal layer CL2 f are etched, using the photosensitive film pattern PRT as the mask. When the first metal layer CL1 and the second metal layer CL2 are etched, the etching is performed using the aforementioned etchant composition.

Figure 5:
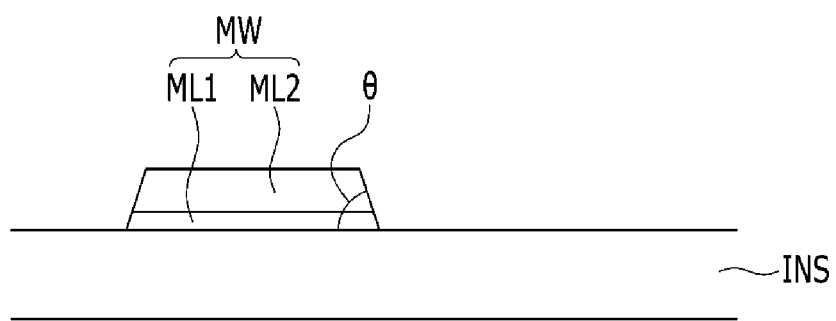

As a result, a metal wire MW is formed that includes a first metal wire ML1 formed of the first metal and a second metal wire ML2 formed of the second metal. Subsequently, as shown in FIG. 5, the remaining photosensitive film pattern PRT. The metal wire formed of the first metal and the second metal, that is, a titanium/copper metal wire, may be manufactured through the aforementioned procedure.

Figure 6:
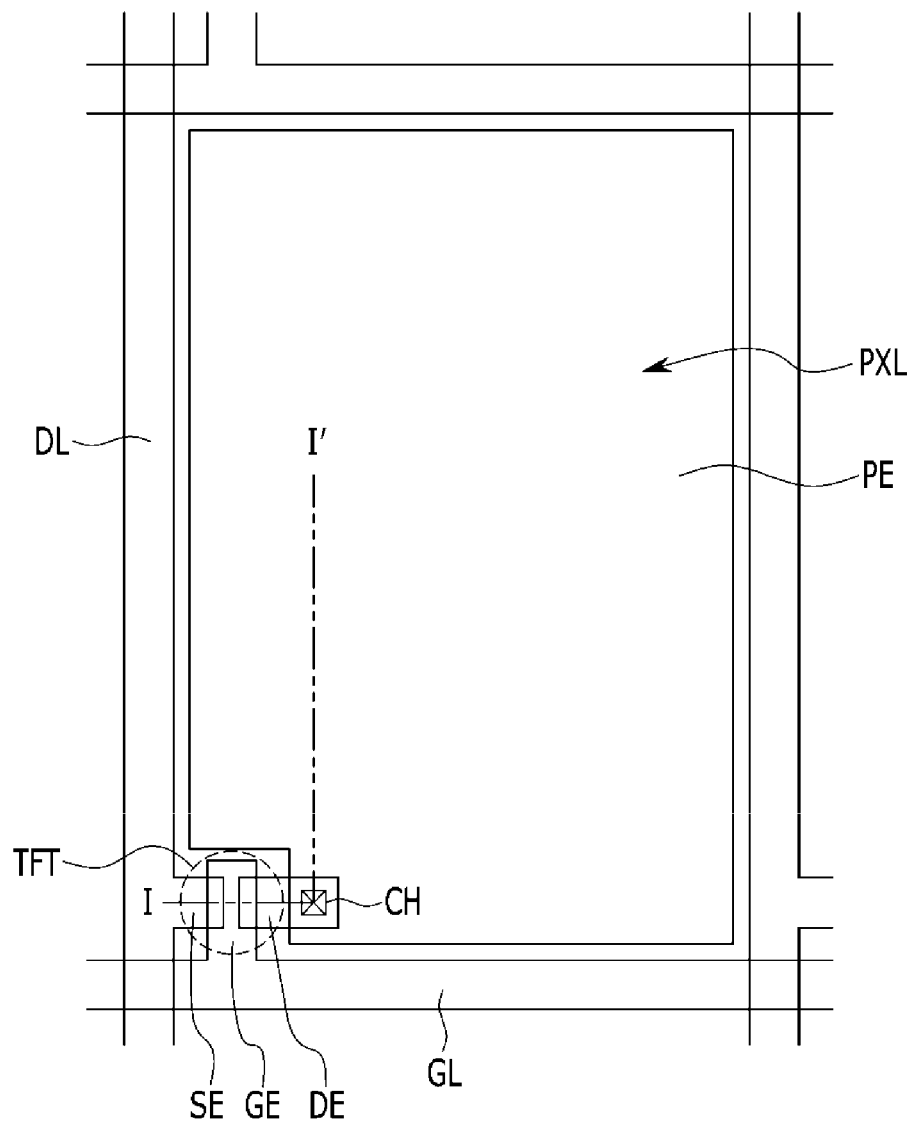
FIG. 6 is a top plan view showing a structure of a display device manufactured by using the etchant composition, according to the exemplary embodiment of the present invention.
Figure 7:
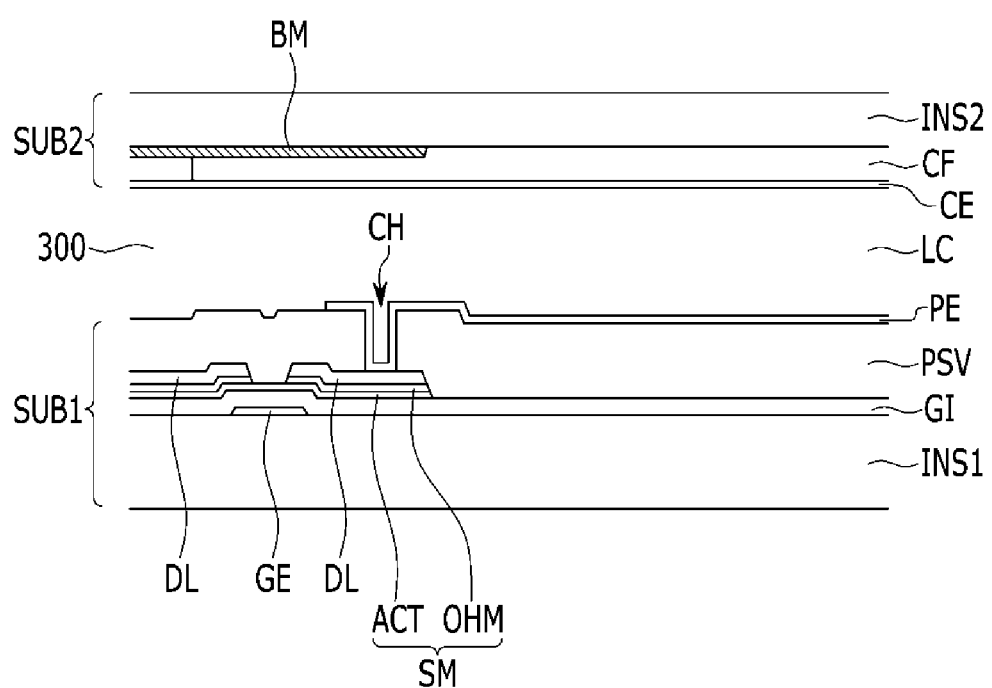
FIG. 7 is a cross-sectional view taken along line I-I' of FIG. 6.

FIG. 6 is a top plan view showing a structure of a display device manufactured by using the etchant composition, according to an exemplary embodiment of the present invention. FIG. 7 is a cross-sectional view taken along line I-I' of FIG. 6.

The display device has a plurality of pixels and operates to display an image. Herein, the display device is not particularly limited, and examples thereof may include various display panels, such as a liquid crystal display panel, an organic light emitting display panel, an electrophoretic display panel, an electrowetting display panel, and an MEMS display panel (microelectromechanical system display panel). In this exemplary embodiment of the present invention, the liquid crystal display is shown as an example, but the present invention is not limited thereto. Herein, since each pixel has the same structure, for convenience of description, one pixel and a gate line GL and a data line DL adjacent thereto will be shown and described.

Referring to FIGS. 6 and 7, the display device includes a first display panel SUB1 provided with a plurality of pixels PXL, a second display panel SUB2 facing the first display panel SUB1, and a liquid crystal layer LC formed between the first display panel SUB1 and the second display panel SUB2.

The first display panel SUB1 includes a first insulating substrate INS1, and a plurality of gate lines GL and data lines DL provided on the first insulating substrate INS1. The gate lines GL are formed to extend in a first direction on the first insulating substrate INS1. The data lines DL are formed on the gate insulating layer GI, and extend in a second direction crossing the first direction.

Each pixel PXL is connected to a corresponding gate line GL and a corresponding data line DL. Each pixel PXL includes a thin film transistor and a pixel electrode PE connected to the thin film transistor.

The thin film transistor includes a gate electrode GE, a semiconductor layer SM, a source electrode SE, and a drain electrode DE. The gate electrode GE may be a portion protruding from the gate line GL.

The semiconductor layer SM is positioned on the gate electrode GE with a gate insulating layer GI interposed therebetween. The semiconductor layer SM includes an active layer ACT positioned on the gate insulating layer GI and an ohmic contact layer OHM positioned on the active layer ACT. The active layer ACT is positioned in the region where the source electrode SE and the drain electrode DE are formed and in a region corresponding to the region between the source electrode SE and the drain electrode DE, on a plate surface. The ohmic contact layer OHM is formed between the active layer ACT and the source electrode SE, and between the active layer ACT and the drain electrode DE.

The source electrode SE is formed to be branched from the data line DL, and at least a portion thereof overlaps the gate electrode GE, when seen from a plate surface. The drain electrode DE is formed to be spaced from the source electrode SE, and at least a portion thereof overlaps the gate electrode GE, when seen from the plate surface.

The pixel electrode PE is connected to the drain electrode DE with a passivation layer PSV interposed therebetween. The passivation layer PSV has a contact hole CH through which a portion of the drain electrode DE is exposed. The pixel electrode PE is connected to the drain electrode DE through the contact hole CH.

The second display panel SUB2 is provided to face the first display panel SUB1, and includes a second insulating substrate INK, a color filter CF formed on the second insulating substrate INK to display a color, a black matrix BM provided at the circumference of the color filter CF to block light, and a common electrode CE to form an electric field together with the pixel electrode PE.

Figure 8:
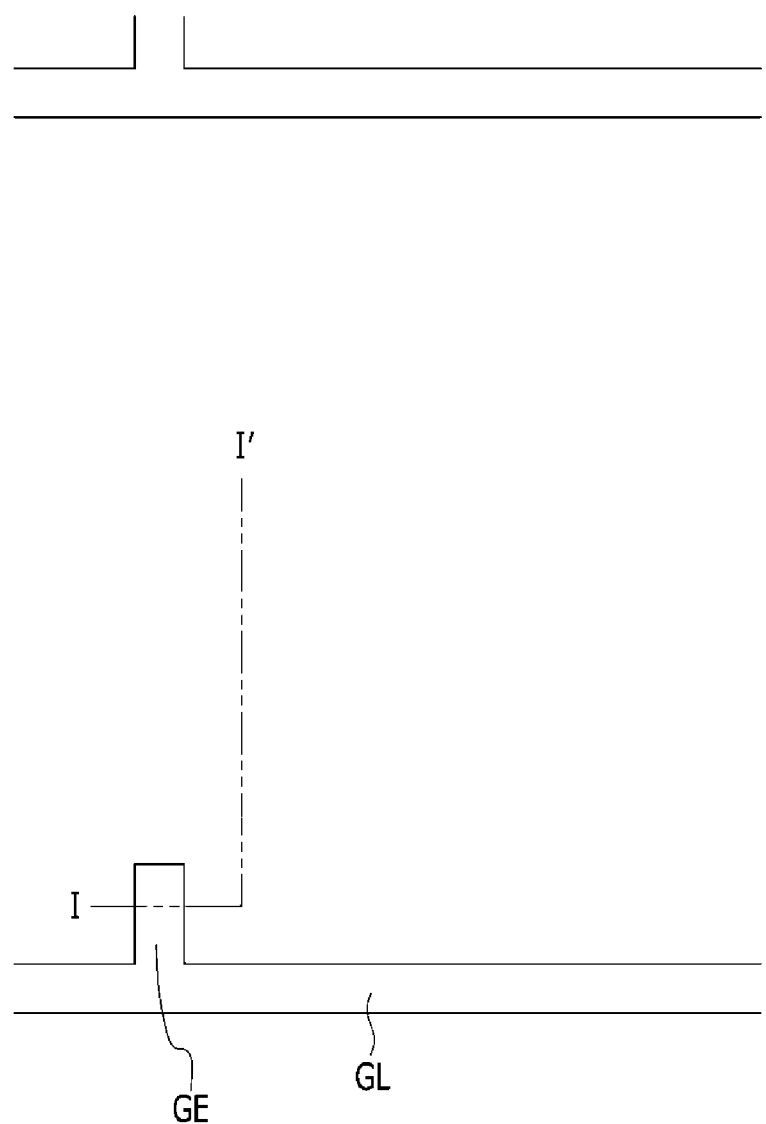
FIGS. 8, 9, and 10 are top plan views sequentially showing a method of manufacturing a thin film transistor array panel of a display device, according to an exemplary embodiment of the present invention.
Figure 9:
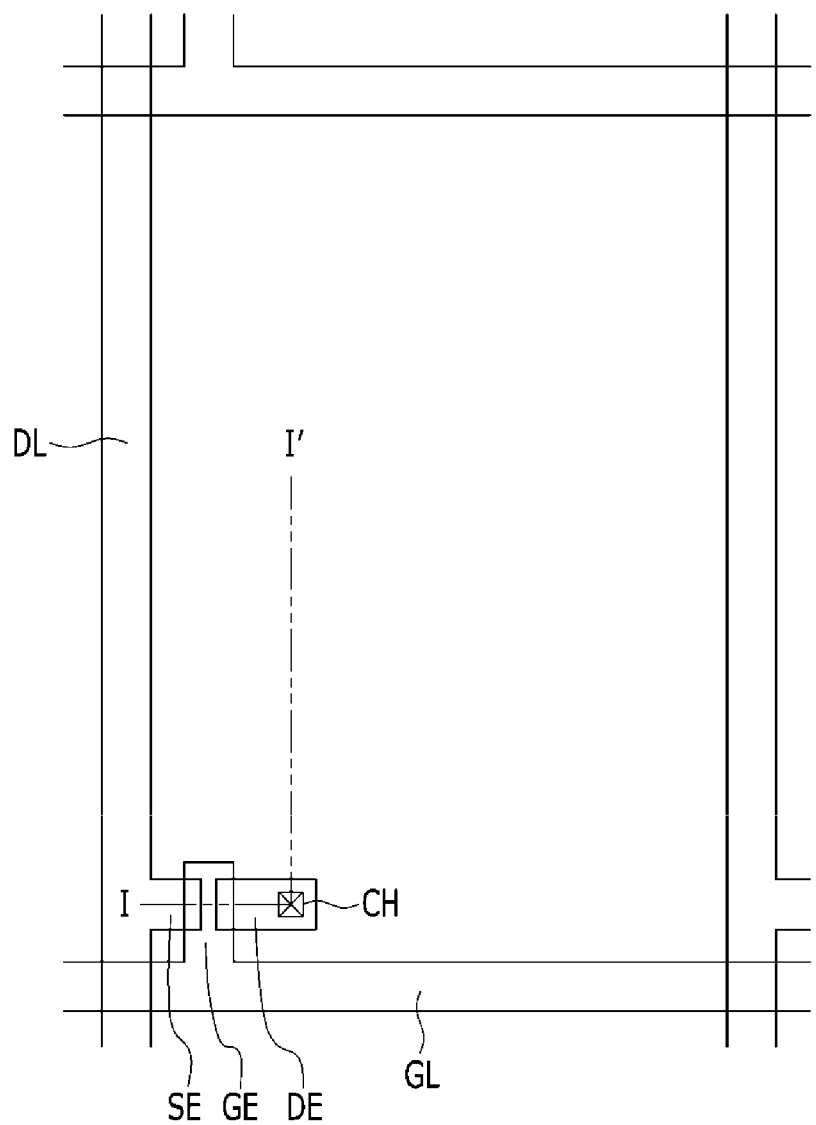
Figure 10:
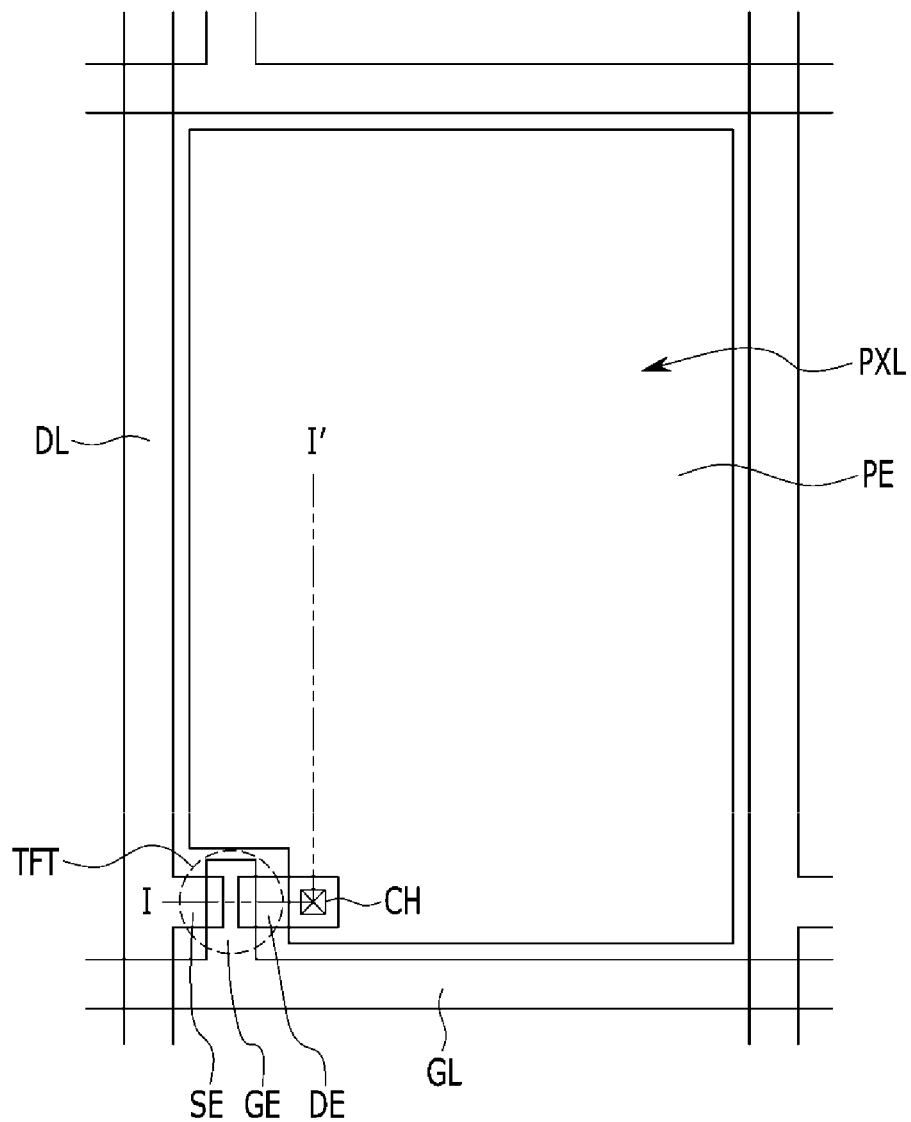
Figure 11:
FIGS. 11, 12, and 13 are cross-sectional views taken along line I-I' of FIGS. 8, 9, and 10.
Figure 12:
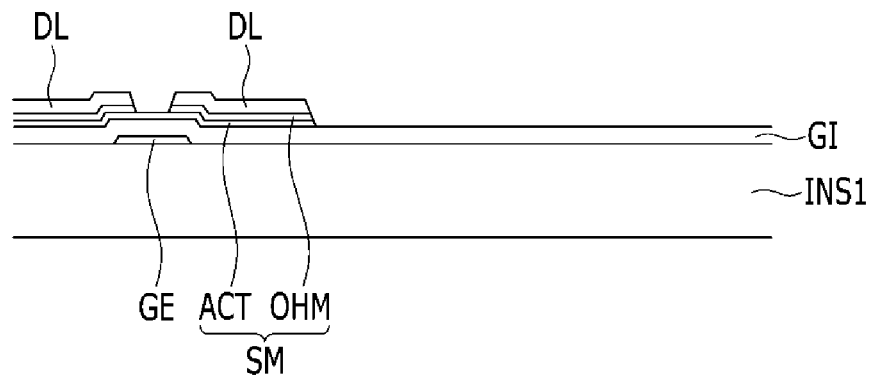
Figure 13:
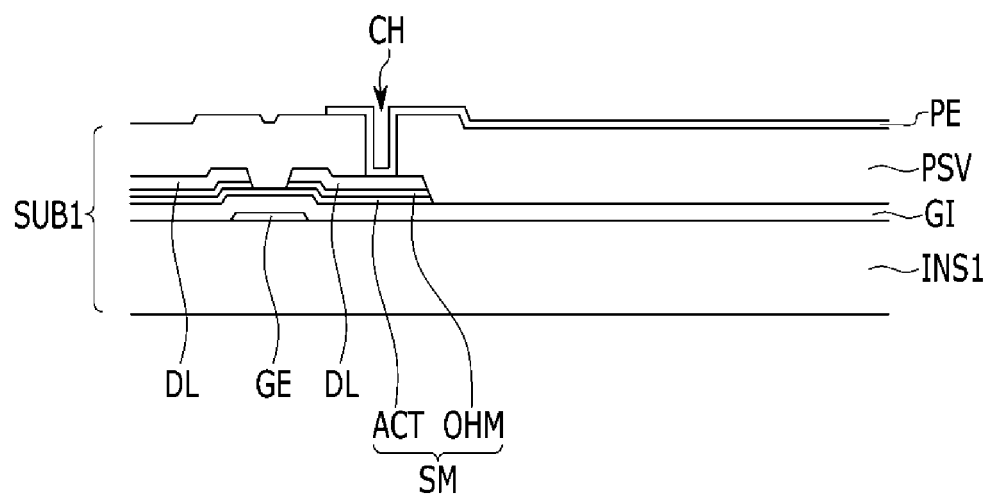

FIGS. 8 to 10 are top plan views sequentially showing a process of manufacturing a thin film transistor array panel in a method of manufacturing the display device according to the exemplary embodiment of the present invention. FIGS. 11 to 13 are cross-sectional views taken along line I-I' of FIGS. 8 to 10.

Referring to FIGS. 8 and 11, a first wire portion is formed on the first insulating substrate INS1 by using a first photolithography process. The first wire portion includes a gate line GL extending in the first direction, and the gate electrode GE connected to the gate line GL.

The gate line GL is formed by sequentially laminating the first metal and the second metal on the first insulating substrate INS1, to form the first metal layer and the second metal layer formed on the first metal layer, and then etching the first metal layer and the second metal layer by using the first mask (not shown). The first metal layer may be formed of titanium, and the second metal layer may be formed of copper. Herein, the first metal layer may be formed to a thickness of about 50 Å to about 300 Å, and the second metal layer may be formed to a thickness of about 2000 Å to about 5000 Å. The first metal layer and the second metal layer are etched by the aforementioned etchant composition. In this case, the first wire is etched so that a taper angle is about 25° to about 50°. The taper angle refers to an angle formed by a lateral surface of the metal wire and an upper surface of the insulating substrate. Accordingly, the gate line GL and the gate electrode GE are formed to have a double-layer structure, where the first metal and the second metal are sequentially laminated.

Referring to FIGS. 9 and 12, the gate insulating layer GI is formed on the first insulating substrate INS1, on which the first wire portion is formed, and a semiconductor pattern and a second wire portion are formed on the first insulating substrate INS1, on which the gate insulating layer GI is formed by using a second photolithography process. The second wire portion includes the data line DL extending in the second direction in which the gate line GL extends, the source electrode SE extending from the data line DL, and the drain electrode DE spaced from the source electrode SE. The gate insulating layer GI is formed by laminating a first insulating material on the first insulating substrate INS1, on which the first wire portion is formed.

The second wire portion is formed by sequentially laminating the first semiconductor material, the second semiconductor material, and the third conductive material on the first insulating substrate INS1, and selectively etching a first semiconductor layer (not shown), a second semiconductor layer (not shown), and a third conductive layer (not shown) formed of the first semiconductor material, the second semiconductor material, and the third conductive material, respectively, by using the second mask (not shown). The second mask may be a slit mask or a diffraction mask.

The third conductive material may be a metal such as copper, molybdenum, aluminum, tungsten, chromium, and titanium, or an alloy including at least one of the aforementioned metals. In the case where the third conductive layer is etched, a predetermined etchant composition suitable to etch the third conductive layer is used. An etchant composition that is different from the etchant composition used to form the first wire may be selected, so that the taper angle of the third conductive layer is larger than the taper angle of the first wire.

Referring to FIGS. 10 and 13, a passivation layer PSV, having a contact hole CH through which a portion of the drain electrode DE is exposed, is formed on the first insulating substrate INS1 on which the second wire portion is formed, by using a third photolithography process. The passivation layer PSV may be formed by laminating a second insulating material layer (not shown) of the second insulating material and a photosensitive film (not shown) on the first insulating substrate INS1 on which the second wire portion is formed, exposing and developing the photosensitive film to form a photosensitive film pattern (not shown), and removing a portion of the second insulating material layer using the photosensitive film pattern as a mask.

Referring to FIG. 13 again, a pixel electrode PE, provided on the passivation layer PSV and connected to the drain electrode DE through the contact hole CH, is formed by using a fourth photolithography process. The pixel electrode PE is formed by sequentially laminating a transparent conductive material layer (not shown) and a photosensitive film (not shown) on the first insulating substrate INS1 on which the passivation layer PSV is formed, exposing and developing the photosensitive film to form a photosensitive film pattern (not shown), and patterning a transparent conductive material layer using the photosensitive film pattern as a mask.

A first display panel SUB1 is bonded to a second display panel SUB2 on which a color filter layer is formed, so as to face the second display panel SUB2. A liquid crystal layer LC is injected between the first display panel SUB1 and the second display panel SUB2.

As described above, the thin film transistor array panel may be manufactured through total four photolithography processes. Accordingly, it is possible to increase process productivity, and to reduce disconnection defects, resulting from when the first wire portion is formed, by preventing damage to a glass substrate damage and photoresist damage (PR damage), by forming the metal wire using an etchant composition according to Table 1 for the first photolithography process using the first mask. Further, it is possible to minimize the used of environmentally regulated materials, by using ammonium fluoride, and to minimize portions causing temporal, monetary, and environmental limitations during the process, by preventing heat emission of waste water.

TABLE 1

|  | Comparative Example 3 (TCE-W05) | | Example 1 (TCE-W07) | | Note |
|---|---|---|---|---|---|
| As | Detected | | Non-detected | | Improved |
| Heat emission (° C.) | Δ | | ○ | | Improved |
| Glass Attack (Å/sec) | Δ | | ○ | | Improved |
| PR Lifting (sec) | Δ | | ○ | | Improved |
| Glass reduction amount (g, based on 3 days) | Δ | | ○ | | Improved |
| Cu Etch Rate (Å/sec) | ○ | | ○ | | Identical |
| Ti Etch Rate (Å/sec) | Δ | | ○ | | Improved |
| Accumulated process No. | Based on S/E 6500 ppm | | Based on S/E 7000 ppm | | Improved |
| Time (hr) | 9 | | 9 | | Identical |
| Storage over time (day) | Normal temperature | 5 | Normal temperature | 7 | Improved |
| Precipitate (day) | Low temperature (13° C.) | 10 | Low temperature (13° C.) | 13 | Improved |
|  | Normal temperature | No precipitate after 8 days | Normal temperature | No precipitate after 8 days | Identical |
|  | Low temperature (5° C.) | No precipitate after 8 days | Low temperature (5° C.) | No precipitate after 8 days | Identical |
| G.O investigation (EA) | Δ | | ○ | | Improved |
| Bubble forming test | | | Identical | | |

| Favorable | Normal | Poor |
|---|---|---|
| ○ | Δ | X |

Table 2 below shows Example 1 and the Comparative Example for a specific change, according to an increase in heat emission of the etchant, when 3000 ppm of Cu/Ti is dissolved, as compared to Comparative Example 3. In Table 2, DIW is deionized water.

Figure 14:
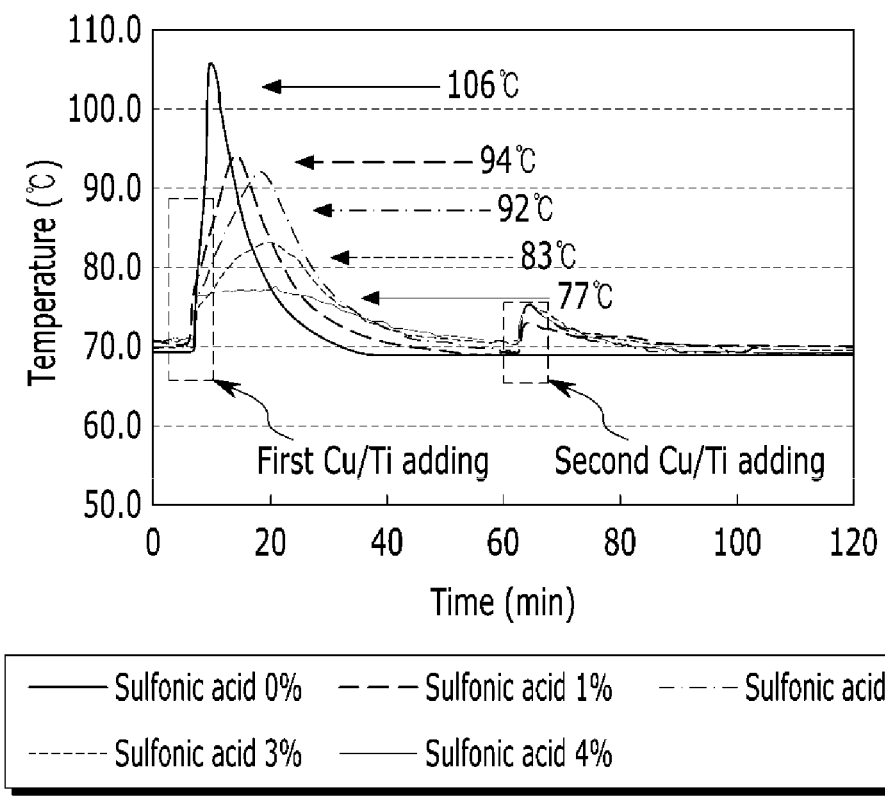
FIGS. 14 and 15 are graphs showing heat emission test results.
Figure 15:
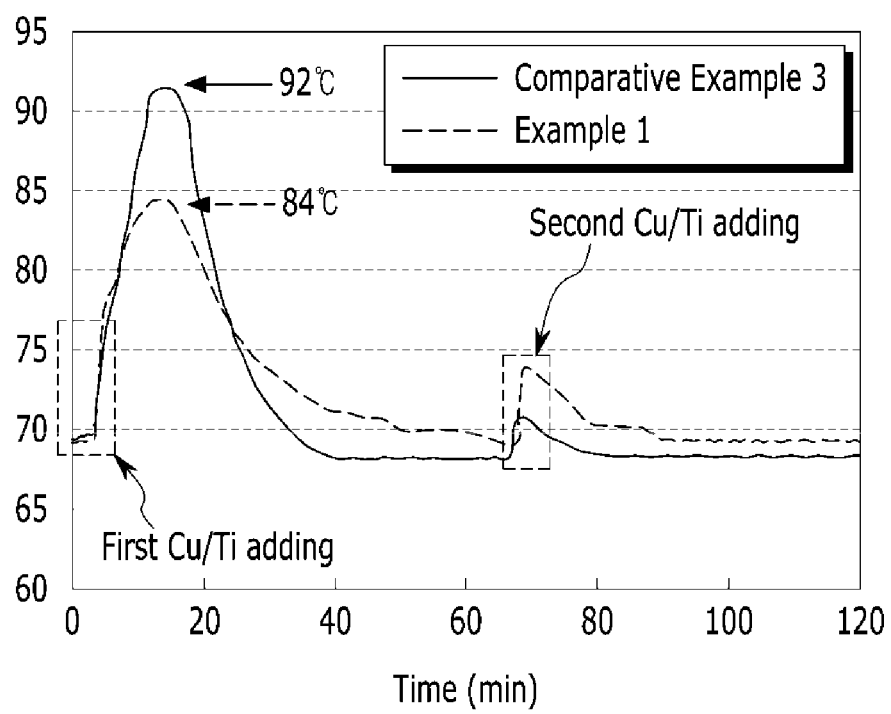

In the following Table 2, it can be seen that a heat emission phenomenon is reduced as the content of sulfonic acid is increased by 1 wt %. In Comparative Example 5, the heat emission temperature is lowest 77° C., but etching characteristics are poor. Accordingly, the composition of Comparative Example 5 is not suitable to be used as the metal etchant. In addition, heat emission test results are shown in FIGS. 14 and 15.

TABLE 2

| | Composition | | | | | | | | Heat emission (° C.) |
|---|---|---|---|---|---|---|---|---|---|
| | Persulfate | Ammonium bifluoride | Ammonium fluoride | Inorganic acid | Cyclic amine compound | Sulfonic acid | Organic acid | DIW | |
| Comparative Example 1 | ○ | ○ | — | ○ | ○ | 0 | ○ | ○ | 106 |
| Comparative Example 2 | ○ | ○ | — | ○ | ○ | 1 | ○ | ○ | 94 |

TABLE 2-continued

| | | | | | | | | | |
|---|---|---|---|---|---|---|---|---|---|
| Comparative Example 3 (TCE-W05) | ○ | ○ | — | ○ | ○ | 2 | ○ | ○ | 92 |
| Comparative Example 4 | ○ | ○ | — | ○ | ○ | 3 | ○ | ○ | 83 |
| Comparative Example 5 | ○ | ○ | — | ○ | ○ | 4 | ○ | ○ | 77 |
| Example 1 TCE-W07 | ○ | — | ○ | ○ | ○ | 3 | ○ | ○ | 83 |

Added ○  Not added —

Figure 16:
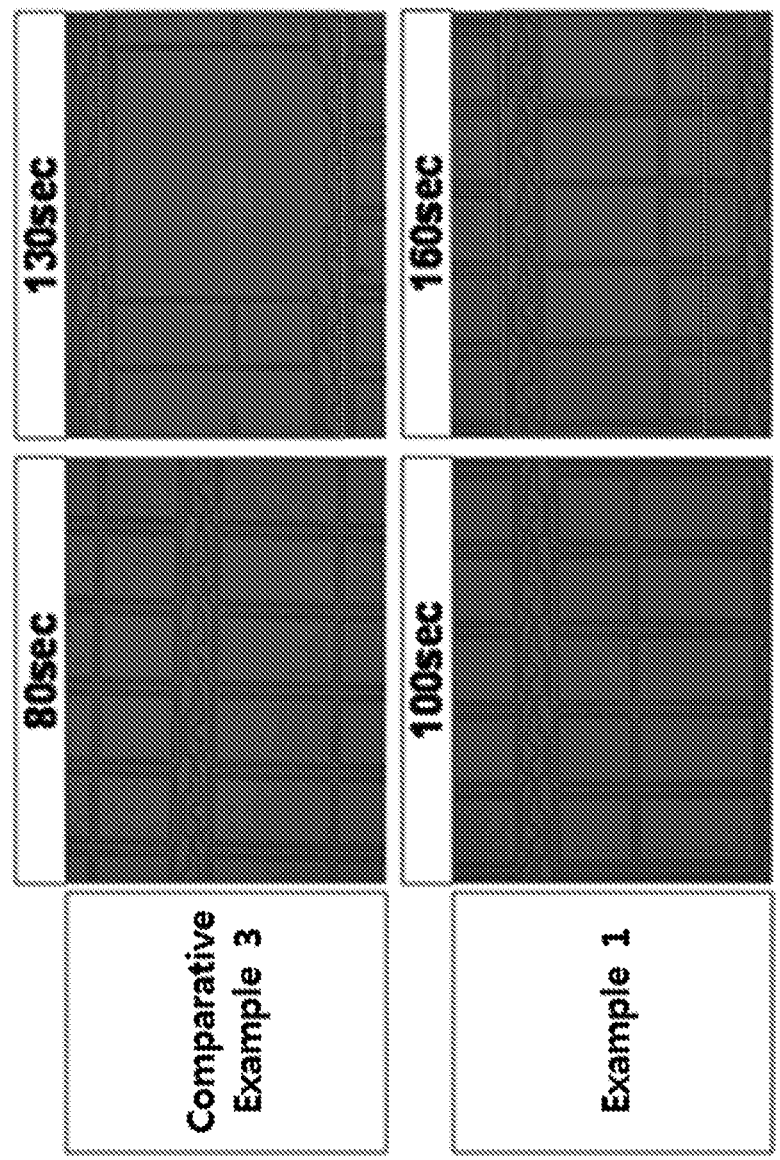
FIG. 16 includes pictures illustrating evaluation of a photoresist lifting (PR Lifting) of a Comparative Example 3 and an Example 1.
Figure 17:
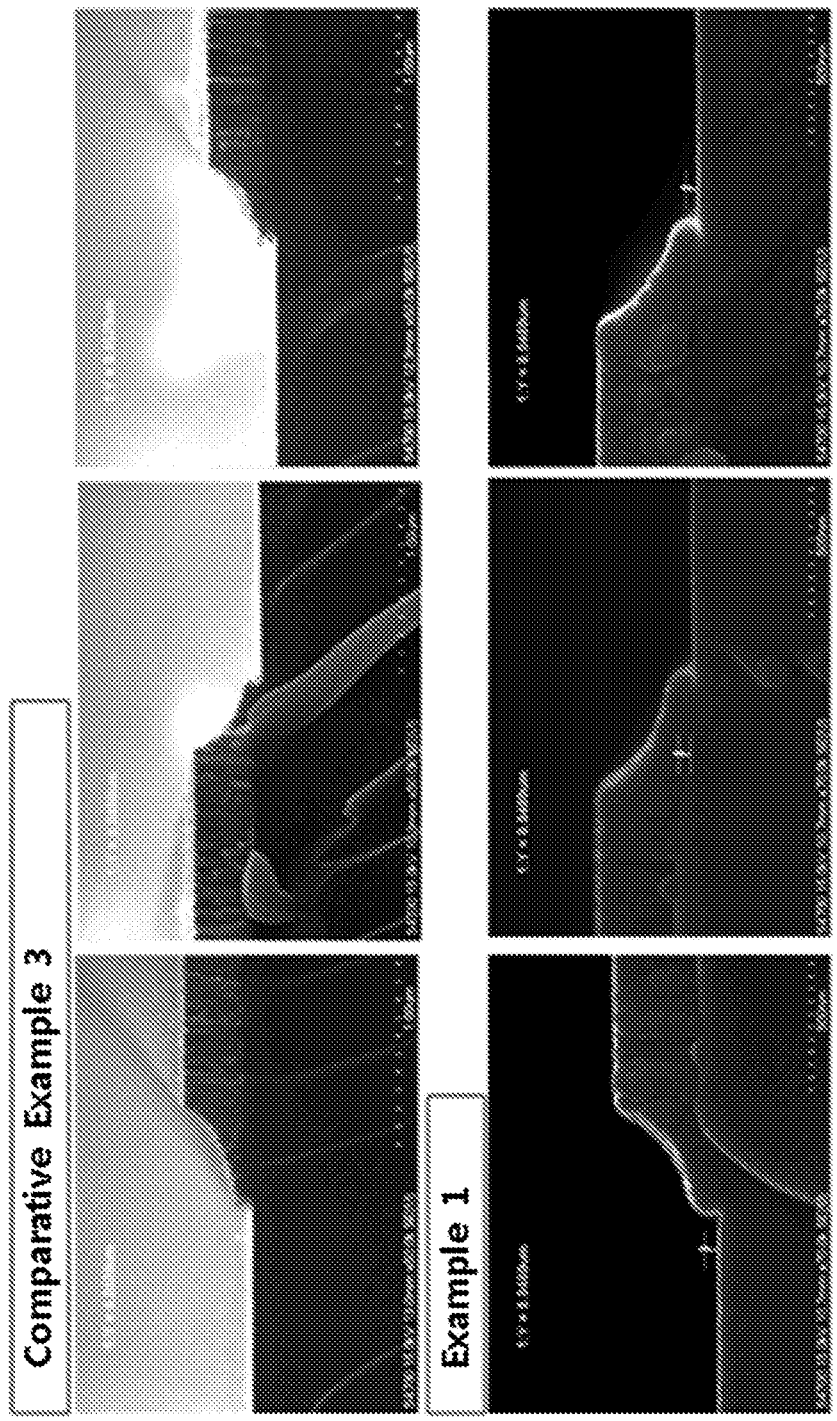
FIG. 17 includes cross-sectional SEM micrographs showing glass substrate damage after etching using the etchant compositions of Comparative Example 3 and Example 1.

The following Table 3 shows comparison and analysis results in terms of a damage according to etching in Comparative Example 3 and Example 1. First, an evaluation of a photoresist lifting (PR lifting) is a relative comparison for a time of removal of a photoresist, when the photoresist pattern is formed on the glass substrate and immersed in the etchant maintained at a constant temperature of 28° C. (FIG. 16). In addition, evaluation of the glass substrate damage is a relative comparison of damage to cross-sectional shapes formed on the glass substrate, after a patterned metal acting as the mask is formed on the upper portion of the glass substrate and is then etched by using evaluation equipment for a predetermined time. (FIG. 17)

An increase or a decrease in corrosion by the etchant may be judged through an evaluation of the damage. Referring to FIG. 16 and the following Table 3, in Example 1 it can be seen that the degree of corrosion is reduced as the photoresist lifting time is increased, which results in reduced wire defects, as compared to Comparative Example 3. Referring to FIG. 17 and the following Table 3, it can be seen that the degree of glass substrate damage in Example 1 is less than that of compared to Comparative Example 3.

TABLE 3

| | Composition | | | | | | | | PR Lifting (sec) | Glass Damage (Å/sec) |
|---|---|---|---|---|---|---|---|---|---|---|
| | Persulfate | Ammonium bifluoride | Ammonium fluoride | Inorganic acid | Cyclic amine compound | Sulfonic acid | Organic acid | D.I | | |
| Comparative Example 3 (TCE-W05) | ○ | 0.01~2 | — | ○ | ○ | ○ | ○ | ○ | 130 | 8.4 |
| Example 1 (TCE-W07) | ○ | — | 0.01~2 | ○ | ○ | ○ | ○ | ○ | 160 | 7.9 |

Added ○  Not added —

The following Table 4 shows a difference in process number quantities of the etchants of Comparative Example 3 and Example 1.

Figure 18:
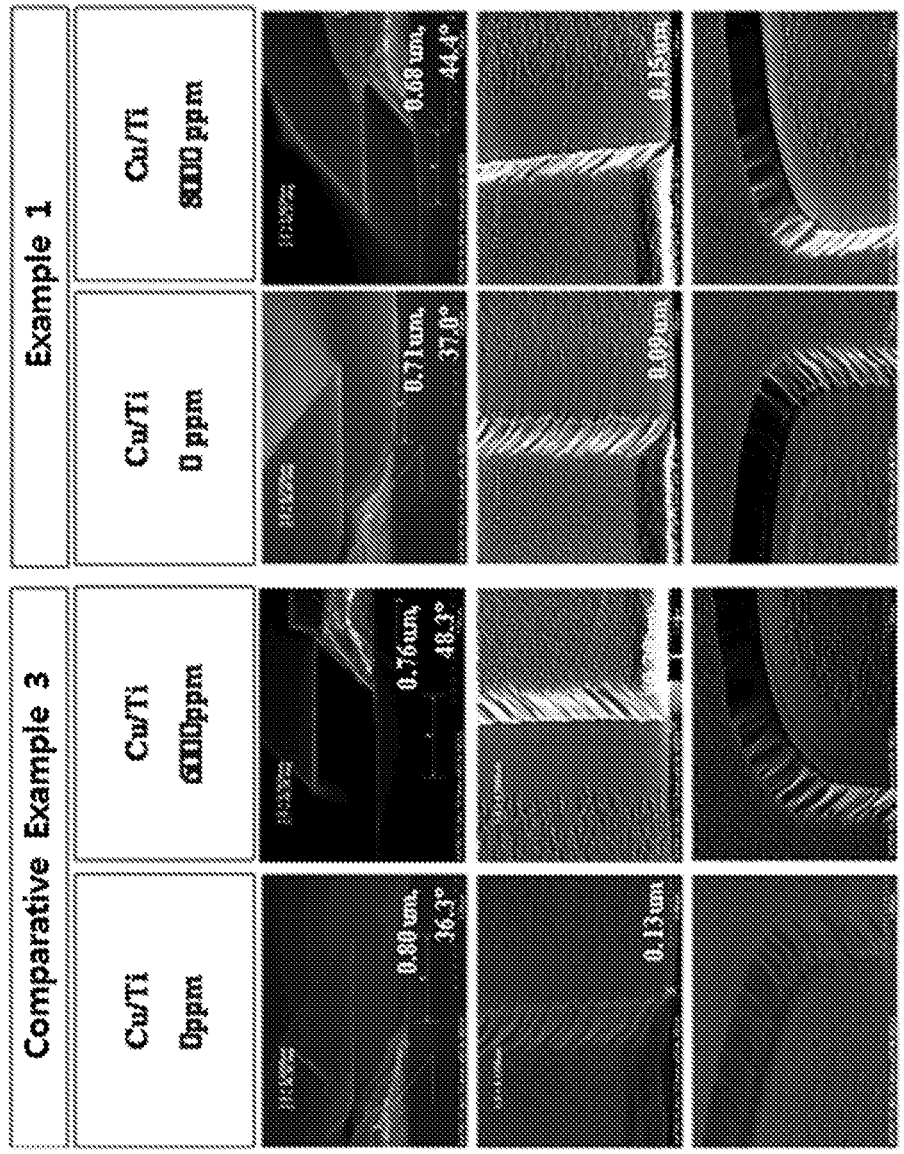
FIG. 18 includes SEM micorgraphs measuring a difference between process number quantities of the etchant compositions of Comparative Example 3 and Example 1.

Accordingly, a result of an increase in process number quantities may be obtained through an improvement in Cu/Ti solubility, by appropriately controlling the content of the organic acid. In addition, measurement and comparison data of the process number SEM of Comparative Example 3 and Example 1 are attached. (FIG. 18)

TABLE 4

| | Composition | | | | | | | | Accumulated Capa (ppm) |
|---|---|---|---|---|---|---|---|---|---|
| | Persulfate | Ammonium bifluoride | Ammonium fluoride | Inorganic acid | Cyclic amine compound | Sulfonic acid | Organic acid | D.I | |
| Comparative Example 3 (TCE-W05) | ○ | ○ | — | ○ | ○ | ○ | 0.1~12 | 0 | 6500 |
| Example 1 (TCE-W07) | ○ | — | ○ | ○ | ○ | ○ | 0.1~12 | 0 | 8000 |

Added ○  Not added —

The following Table 5 shows test results for various amounts of ammonium fluoride in the etchant composition, according to various embodiments of the present invention. Specifically, the etchants were manufactured so that the content of ammonium fluoride was adjusted to 0.3 wt %, 0.5 wt %, 0.9 wt %, and 1.1 wt %, based on Example 1 (TCE-W07), and the etching tests for the copper/titanium layer were performed.

Figure 19:
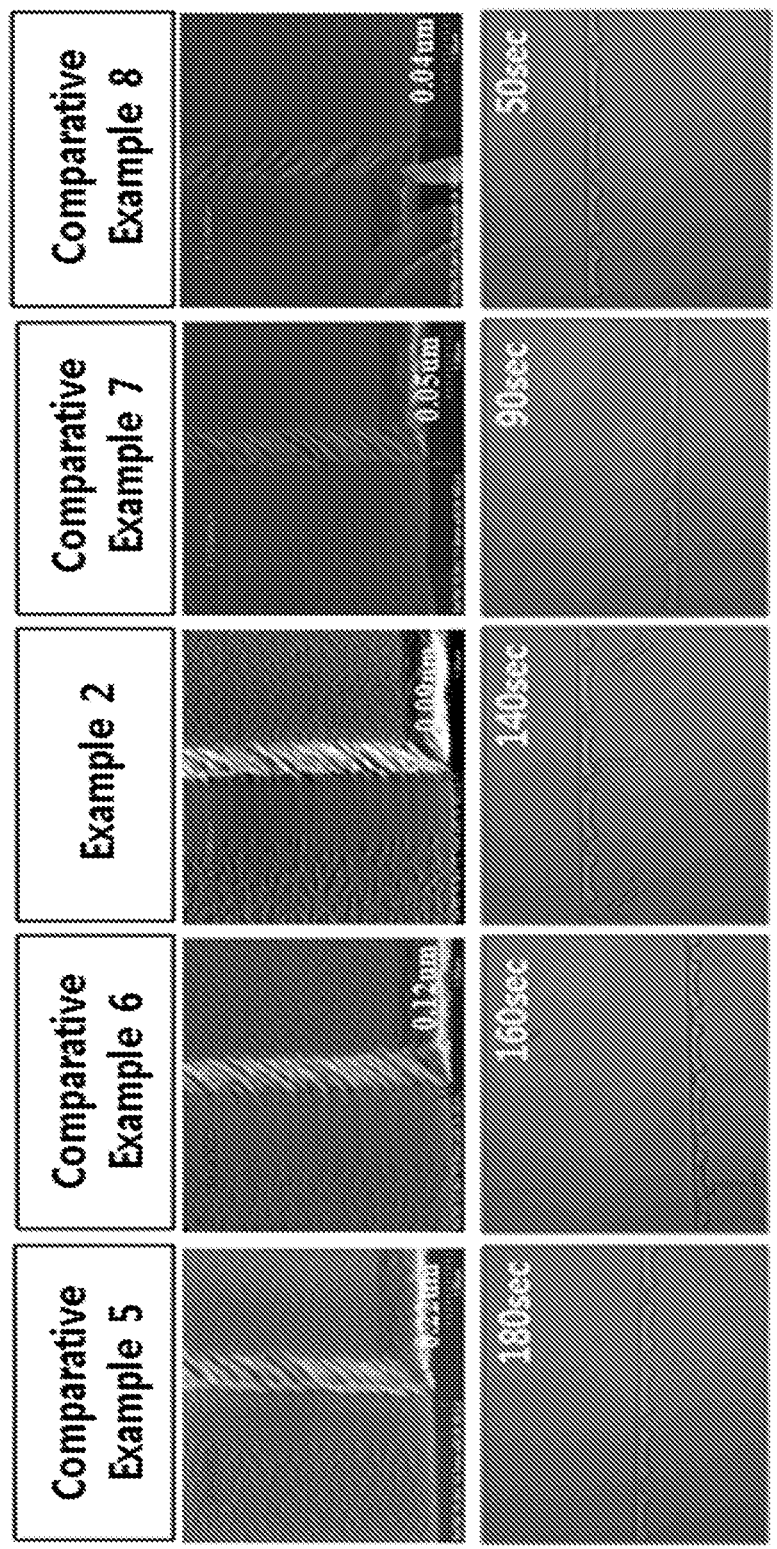
FIG. 19 includes pictures illustrating evaluations of titanium tail (Ti Tail) and photoresist lifting of copper/titanium layers, after etching using the etchant compositions of Comparative Examples 1 to 4 and Example 1.
Figure 20:
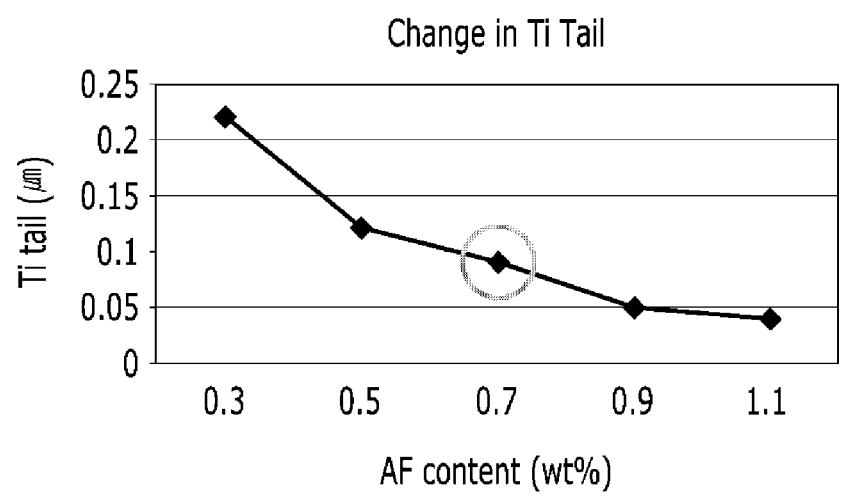
FIG. 20 is a graph obtained by evaluating the titanium tails.
Figure 21:
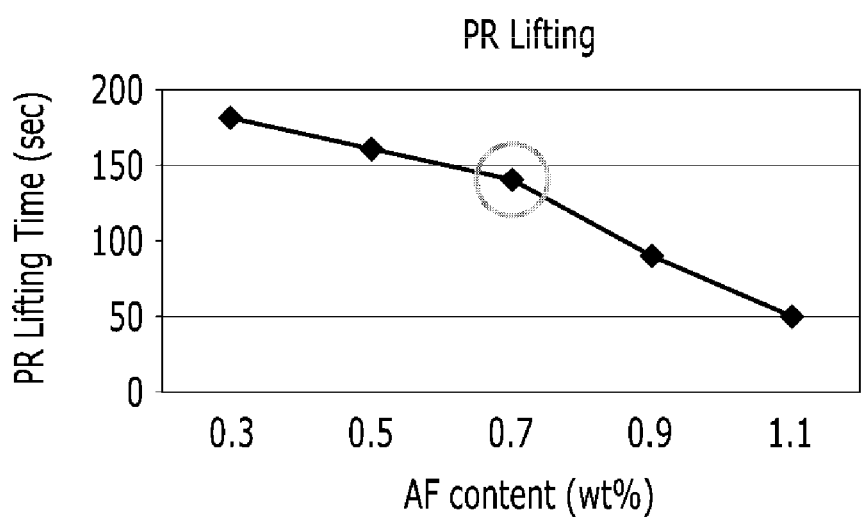
FIG. 21 is a graph showing photoresist lifting results.

FIG. 19 shows illustrates an evaluation of the titanium tail (Ti Tail) and the photoresist lifting, after the copper/titanium layers are etched in Comparative Examples 5 to 8 and Example 2. FIGS. 20 and 21 are graphs showing the test results. As shown, the photoresist time is increased as the content of ammonium fluoride is reduced. Accordingly, it is expected that titanium residual defects are increased, due to an increase in titanium tail, which is advantageous to reducing damage to a glass substrate and corrosion defects. Therefore, the content of ammonium fluoride in the etchant composition, according to various embodiments of the present invention, may be from 0.5 wt % to 0.9 wt %. In some embodiments, the content of ammonium fluoride in the etchant composition may be 0.7 wt %.

TABLE 5

| Etchant | Persulfate | Ammonium fluoride | Inorganic acid | Cyclic amine compound | Organic acid salt | Organic acid | Sulfonic acid | Ti Tail (μm) | PR Lifting (sec) |
|---|---|---|---|---|---|---|---|---|---|
| Comparative Example 5 | 15 | 0.3 | 3 | 1.2 | 2.5 | 8 | 3 | 0.22 | 180 |
| Comparative Example 6 | 15 | 0.5 | 3 | 1.2 | 2.5 | 8 | 3 | 0.12 | 160 |
| Example 1 (TCE-W07) | 15 | 0.7 | 3 | 1.2 | 2.5 | 8 | 3 | 0.09 | 140 |
| Comparative Example 7 | 15 | 0.9 | 3 | 1.2 | 2.5 | 8 | 3 | 0.05 | 90 |
| Comparative Example 8 | 15 | 1.1 | 3 | 1.2 | 2.5 | 8 | 3 | 0.04 | 50 |

The following Table 6 shows test results for different amounts of the organic acid in etchant compositions, according various embodiments of the present invention. Specifically, the etchants were manufactured so that the content of the organic acid was adjusted to 3 wt %, 5 wt %, 10 wt %, and 12 wt %, based on the Example 1 (TCE-W07), and the etching tests for the copper/titanium layer were performed.

Figure 22:
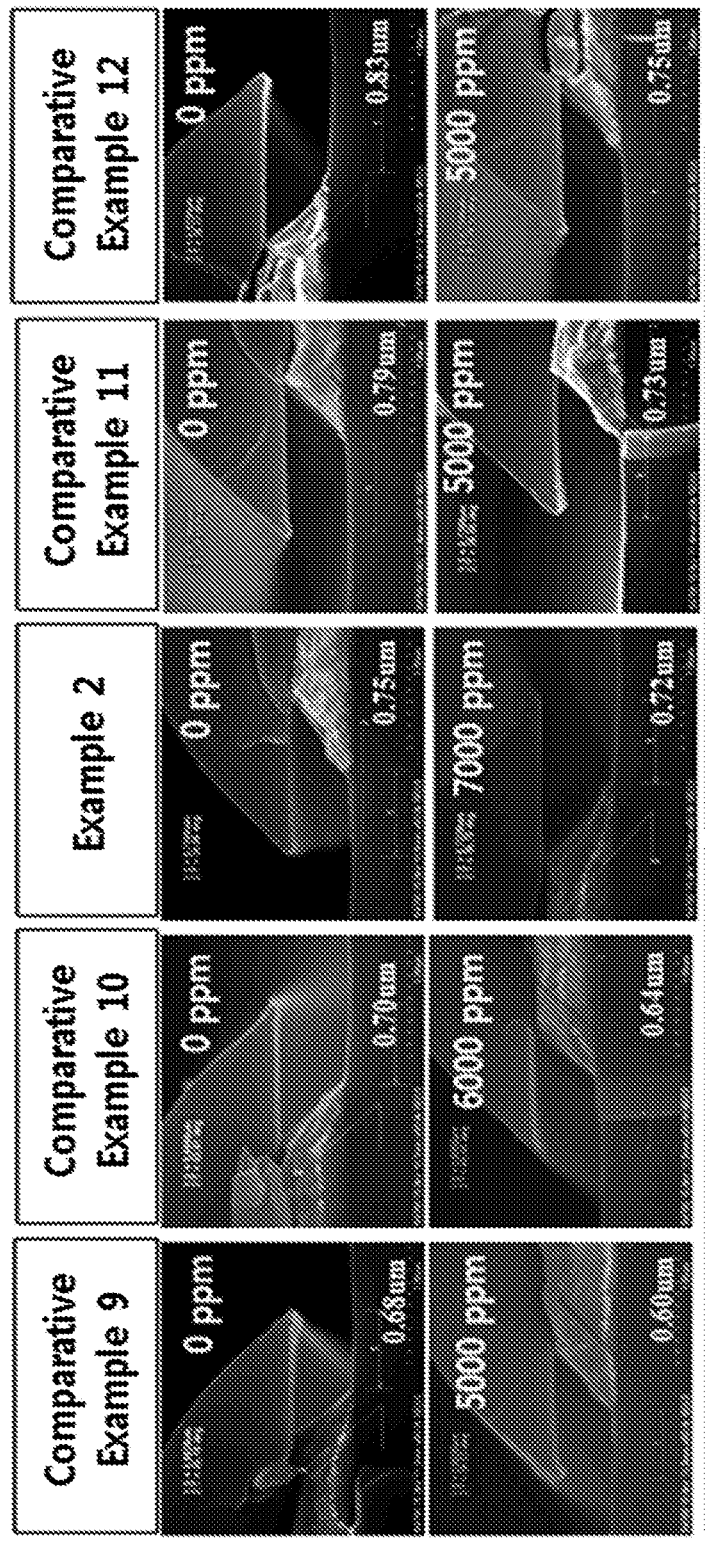
FIG. 22 includes pictures illustrating a change in CD skews of the copper/titanium layers after etching using the etchant compositions of Comparative Examples 1 to 4 and Example 1.
Figure 23:
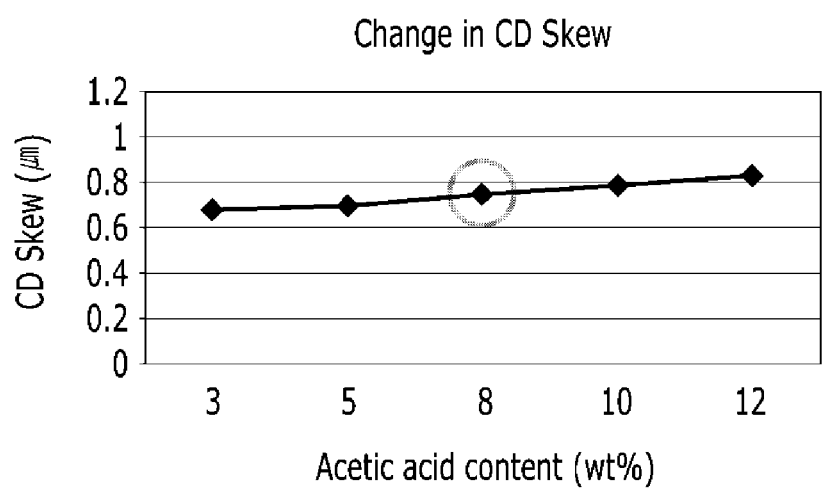
FIG. 23 is a graph obtained by evaluating CD skew.
Figure 24:
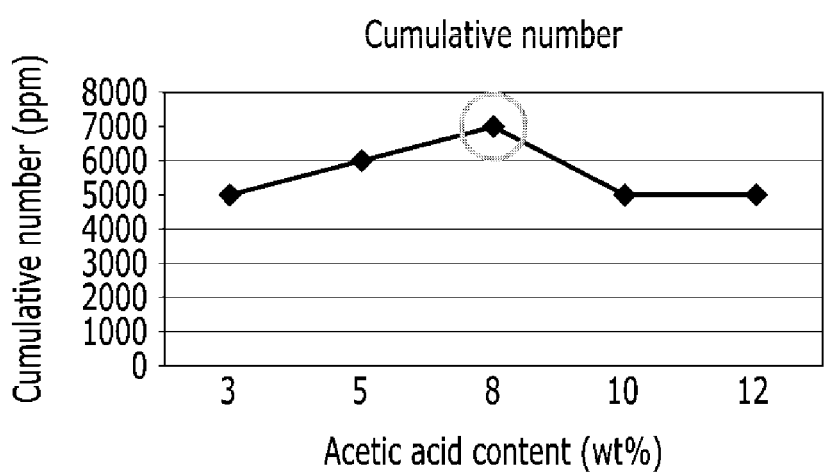
FIG. 24 is a graph obtained by evaluating the process numbers.

The following Table 6 shows test results for various amounts of the organic acid (e.g.: acetic acid ($CH_3COOH$)) in the etchant composition. FIG. 22 shows pictures illustrating a change in CD skew (cut dimension skew) after the copper/titanium layer is etched in Comparative Examples 9 to 12 and Example 2, and FIGS. 23 and 24 are graphs showing the test results. The CD skew (cut dimension skew) may refer to a distance between an end of the photoresist and an end of the copper layer.

As shown, if the content of the organic acid is less than 5 wt %, the CD skew is reduced. If the content is more than 8 wt %, it is shown that the CD skew is discontinuously increased due to an interaction between compositional components. The CD skew is not significantly changed according to the content of the organic acid. In addition, the process number is increased as the content of the organic acid is increased, and is reduced if the content of the organic acid is more than 8 wt %. Therefore, the content of the organic acid in the etchant composition may be about 5 wt % to about 10 wt %. According to some embodiments, the content of the organic acid in the etchant composition may be about 8 wt %.

TABLE 6

| Etchant | Persulfate | Ammonium fluoride | Inorganic acid | Cyclic amine compound | Organic acid salt | Organic acid | Sulfonic acid | Initial lateral side skew (μm) | Accumulated process No. (ppm) |
|---|---|---|---|---|---|---|---|---|---|
| Comparative Example 9 | 15 | 0.7 | 3 | 1.2 | 2.5 | 3 | 3 | 0.68 | 5000 |
| Comparative Example 10 | 15 | 0.7 | 3 | 1.2 | 2.5 | 5 | 3 | 0.70 | 6000 |
| Example 1 (TCE-W07) | 15 | 0.7 | 3 | 1.2 | 2.5 | 8 | 3 | 0.75 | 7000 |
| Comparative Example 11 | 15 | 0.7 | 3 | 1.2 | 2.5 | 10 | 3 | 0.79 | 5000 |

TABLE 6-continued

| Etchant | Persulfate | Ammonium fluoride | Inorganic acid | Cyclic amine compound | Organic acid salt | Organic acid | Sulfonic acid | Initial lateral side skew (μm) | Accumulated process No. (ppm) |
|---|---|---|---|---|---|---|---|---|---|
| Comparative Example 12 | 15 | 0.7 | 3 | 1.2 | 2.5 | 12 | 3 | 0.83 | 5000 |

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing a metal wire, comprising:
   laminating a copper layer and a titanium layer to form a metal layer;
   etching the metal layer using a photosensitive film pattern as a mask; and
   removing the photosensitive film pattern from the etched metal layer,
   wherein the metal layer is etched using an etchant composition, based on the total weight of the etchant composition, about 0.5 wt % to about 20 wt % of a persulfate, about 0.5 wt % to about 0.9 wt % of an ammonium fluoride, about 1 wt % to about 10 wt % of an inorganic acid, about 0.5 wt % to about 5 wt % of a cyclic amine compound, about 0.1 wt % to about 10.0 wt % of a sulfonic acid, about 7.5 wt % to about 12.5 wt % of an organic acid other than the sulfonic acid, and a salt of the organic acid, and a remainder of water,
   wherein a ratio of the wt % of the organic acid salt to the wt % of the organic acid is 1:2 to 1:4.

2. The method of claim 1, wherein the titanium layer is disposed on a substrate and the copper layer is disposed on the titanium layer.

3. The method of claim 2, wherein the persulfate is at least one selected from the group consisting of potassium persulfate ($K_2S_2O_8$), sodium persulfate ($Na_2S_2O_8$), and ammonium persulfate (($NH_4$)$_2S_2O_8$).

4. The method of claim 2, wherein the inorganic acid is at least one selected from the group consisting of a nitric acid, a sulfuric acid, a phosphoric acid, and a perchloric acid.

5. The method of claim 2, wherein the cyclic amine compound is at least one selected from the group consisting of an aminotetrazole, an imidazole, an indole, a purine, a pyrazole, a pyridine, a pyrimidine, a pyrrole, a pyrrolidine, and a pyrroline.

6. The method of claim 2, wherein the sulfonic acid is a p-toluenesulfonic acid or a methanesulfonic acid.

7. The method of claim 2, wherein the organic acid is a carboxylic acid, a dicarboxylic acid, a tricarboxylic acid, or a tetracarboxylic acid.

8. The, method of claim 7, wherein the organic acid is at least one selected from the group consisting of an acetic acid, a butanoic acid, a citric acid, a formic acid, a gluconic acid, a glycolic acid, a malonic acid, an oxalic acid, a pentanoic acid, a sulfobenzoic acid, a sulfosuccinic acid, a suifophthalic acid, a salicylic acid, a sulfosalicylic acid, a benzoic acid, a lactic acid, a glyceric acid, a succinic acid, a malic acid, a tartaric acid, an isocitric acid, a propenoic acid, an imminodiacetic acid, and an ethylenediaminetetraacetic acid (EDTA).

9. The method of claim 1, wherein the content of the sulfonic acid is about 3 wt %.

10. A method of manufacturing a thin film transistor array panel, comprising:
    forming a gate line and a gate electrode connected to the gate line, on a substrate;
    forming a data line across the gate line, a source electrode connected to the data line, and a drain electrode spaced apart from the source electrode; and
    forming a pixel electrode connected to the drain electrode,
    wherein the forming of the gate line and the gate electrode comprises:
      laminating a copper layer and a titanium layer to form a metal layer;
      etching the metal layer using a photosensitive film pattern as a mask, and
      removing the photosensitive film pattern from the etched metal layer, and
    wherein the metal layer is etched by an etchant composition comprising, based on the total weight of the etching composition, about 0.5 wt % to about 20 wt % of a persulfate, about 0.5 wt % to about 0.9 wt % of an ammonium fluoride, about 1 wt % to about 10 wt % of an inorganic acid, about 0.5 wt % to about 5 wt % of a cyclic amine compound, about 0.1 wt % to about 10.0 wt % of a sulfonic acid, about 7.5 wt % to about 12.5 wt % of an organic acid other than the sulfonic acid, and a salt of the organic acid, and a remainder of water,
    wherein a ratio of the wt % of the organic acid salt to the wt % of the organic acid is 1: 2 to 1:4.

11. The method of claim 10, wherein the metal layer comprises a titanium layer disposed on a substrate and a copper layer disposed on the titanium layer.

* * * * *